(12) United States Patent
Wang et al.

(10) Patent No.: US 8,344,408 B2
(45) Date of Patent: Jan. 1, 2013

(54) LIGHT EMITTING DIODE PACKAGE HAVING IMPROVED WIRE BONDING STRUCTURE

(75) Inventors: Kai-Lun Wang, Hsinchu (TW); Shih-Yuan Hsu, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 29 days.

(21) Appl. No.: 13/149,790

(22) Filed: May 31, 2011

(65) Prior Publication Data
US 2012/0098003 A1    Apr. 26, 2012

(30) Foreign Application Priority Data
Oct. 21, 2010    (CN) .......................... 2010 1 0515529

(51) Int. Cl.
*H01L 33/00* (2010.01)
*H01L 27/15* (2006.01)
*H01L 21/00* (2006.01)

(52) U.S. Cl. .............. 257/98; 257/81; 257/99; 257/100; 438/26

(58) Field of Classification Search .................. None
See application file for complete search history.

(56) References Cited

U.S. PATENT DOCUMENTS 7,176,623 B2 *  2/2007  Nitta et al. ............... 313/512
2010/0289127 A1 * 11/2010  Kanazawa et al. ........... 257/666

* cited by examiner

*Primary Examiner* — Julio J Maldonado
*Assistant Examiner* — Harpreet Singh
(74) *Attorney, Agent, or Firm* — Altis Law Group, Inc.

(57) ABSTRACT

An exemplary light emitting diode (LED) package includes a substrate, an LED chip mounted on the substrate, and a wire. The LED chip includes a semiconductor structure and an electrode disposed on the semiconductor structure. The wire electrically connects the electrode of the LED chip to an electrical portion of the substrate. The wire has a first joint and a second joint connected to the substrate. The wire forms a first curved portion between the electrode and the first joint and a second curved portion between the first joint and the second joint.

15 Claims, 1 Drawing Sheet

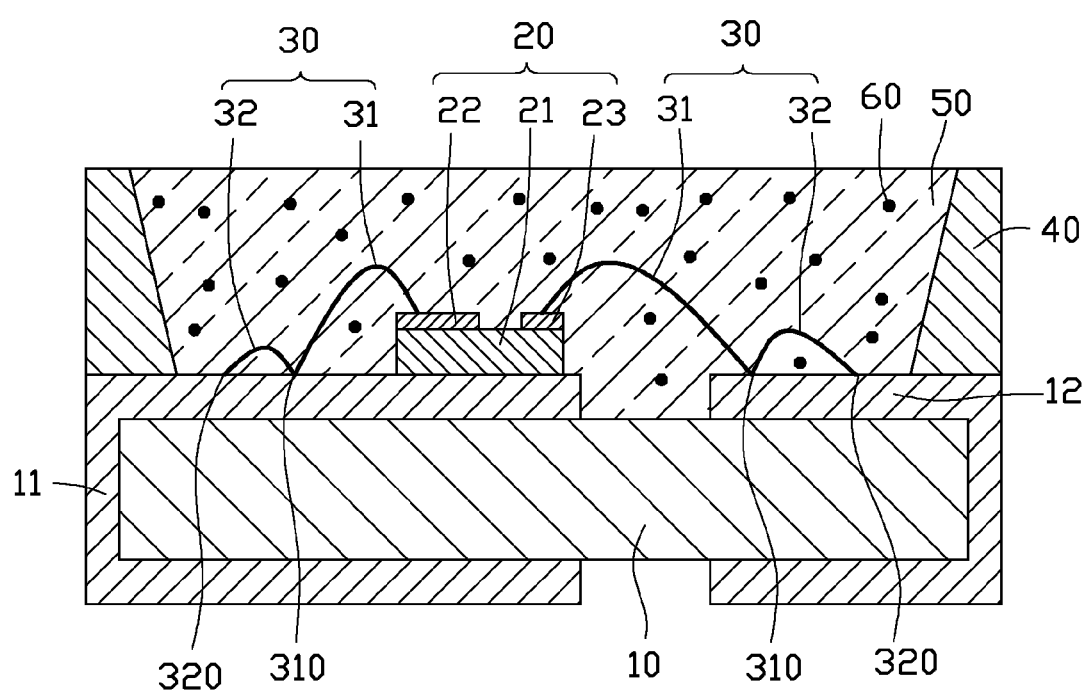

LIGHT EMITTING DIODE PACKAGE HAVING IMPROVED WIRE BONDING STRUCTURE

BACKGROUND

1. Technical Field

The disclosure relates to light emitting diode (LED) packages, and particularly to a light emitting diode package with improved wire bonding structure.

2. Description of the Related Art

Light emitting diodes' (LEDs) many advantages, such as high luminosity, low operational voltage, low power consumption, compatibility with integrated circuits, easy driving, long term reliability, and environmental friendliness have promoted their wide use as a lighting source.

A typical LED package includes a substrate, an LED chip disposed on the substrate and an encapsulation material encapsulating the LED chip. The LED chip has two electrodes for being electrically connected to outer electrodes formed on the substrate. The two electrodes of the LED chip are generally connected to the outer electrodes of the substrate via two wires, respectively. However, in molding of the LED package, the wires, which usually are made of gold, are so fragile that they are prone to be broken when the encapsulation material is injected to encapsulate the LED chip.

Therefore, it is desirable to provide a light emitting diode package which can overcome the described limitations.

BRIEF DESCRIPTION OF THE DRAWINGS

Many aspects of the disclosure can be better understood with reference to the following drawing. The components in the drawing are not necessarily drawn to scale, the emphasis instead being placed upon clearly illustrating the principles of the present light emitting diode package for microminiaturization. Moreover, in the drawing, like reference numerals designate corresponding parts throughout the whole view.

The only drawing is a schematic, cross-sectional view of a light emitting diode (LED) package according to an exemplary embodiment of the present disclosure.

DETAILED DESCRIPTION

Referring to the only drawing, a light emitting diode (LED) package in accordance with an exemplary embodiment of the present disclosure is illustrated. The LED package includes a substrate 10, an LED chip 20 mounted on the substrate 10, two wires 30 electrically connecting the LED chip 20 to the substrate 10, an annular reflecting cup 40 disposed on the substrate 10, and an encapsulant 50 received in the reflecting cup 40 and covering the LED chip 20. The wires 30 preferably are made of gold.

The substrate 10 is made of $Al_2O_3$, silicon, SiC, ceramic, polymer, or electrically insulting quartz. The substrate 10 has a first electrical portion 11 and a second electrical portion 12 formed thereon. The first electrical portion 11 and the second electrical portion 12 extend from a top face of the substrate 10 to a bottom face thereof along an outer edge of the substrate 10, whereby the LED package is formed as a surface mounting type device.

The LED chip 20 is mounted on the first electrical portion 11 of the substrate 10. The LED chip 20 includes a semiconductor structure 21, and a first electrode 22 and a second electrode 23 disposed on a top face of the semiconductor structure 21. The first electrode 22 is electrically connected to the first electrical portion 11 of the substrate 10 via one wire 30, and the second electrode 23 is electrically connected to second electrical portion 12 of the substrate 10 via the other wire 30.

Each of the wires 30 includes a first curved portion 31 and a second curved portion 32. Each of the wires 30 has two joints, i.e. a first joint 310 and a second joint 320, both connecting to the corresponding electrical portion 11 or 12. In detail, one wire 30 extends from the first electrode 22 to the first joint 310 located on the first electrical portion 11 of the substrate 10 to from the first curved portion 31 thereof, and then to the second joint 320 located on the first electrical portion 11 of the substrate 10 to form the second curved portion 32 thereof; the other wire 30 extends from the second electrode 23 to the first joint 310 located on the second electrical portion 12 of the substrate 10 to form the first curved portion 31 thereof, and then to the second joint 320 located on the second electrical portion 12 of the substrate 10 to form the second curved portion 32 thereof. The first curved portion 31 and the second curved portion 32 of each wire 30 are coplanar. In the embodiment of this disclosure, for each wire 30, a curvature of the first curved portion 31 is larger than that of the second curved portion 32, and a length of the first curved portion 31 is larger than that of the second curved portion 32.

When an accidental force is exerted on the wires 30, since the first curved portion 31 and the second curved portion 32 of each wire 30 are both connected to the substrate 10, the first curved portion 31 and the second curved portion 32 can share the force, thereby preventing the wires 30 from being broken easily.

The reflecting cup 40 surrounds the LED chip 20. The reflecting cup 40 is made of a mixture which includes titanium dioxide (TiO2), hardener, and a compound of epoxy resin and silicone. Preferably, the substrate 10 and the reflecting cup 40 can be formed integrally from the same material as a single piece.

The encapsulant 50 is made of transparent materials, such as silicone, epoxy, quartz, or glass. In the present embodiment, the encapsulant 50 further includes fluorescent powder 60 mixed therein, such as YAG, TAG, silicate, nitride, nitrogen oxides, phosphide, arsenide, telluride or sulfide. The fluorescent powder 60 is used for changing color of light from the LED chip 20 into a different color.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An LED package, comprising:
   a substrate having at least an electrical portion;
   an LED chip mounted on the substrate, the LED chip comprising a semiconductor structure and an electrode disposed on the semiconductor structure; and
   a wire electrically connecting the electrode to said at least an electrical portion of the substrate, and the wire extending from the electrode and having a first joint and a second joint, wherein the first joint and the second joint are separated from each other and both of the first joint and the second joint contact the same said at least an electrical portion of the substrate.

2. The light emitting diode package of claim 1, wherein the wire comprises a first curved portion extending from the electrode to the first joint and a second curved portion extending from the first joint to the second joint.

3. The light emitting diode package of claim 2, wherein the first curved portion of the wire is coplanar with the second curved portion of the wire.

4. The light emitting diode package of claim 2, wherein a curvature of the first curved portion is larger than that of the second curved portion.

5. The light emitting, diode package of claim 2, wherein a length of the first curved portion is larger than that of the second curved portion of the wire.

6. The light emitting diode package of claim 1, further comprising a reflecting cup disposed on the substrate and surrounding the LED chip.

7. The light emitting diode package of claim 1, wherein the substrate is made of one of $Al_2O_3$, silicon, SiC, ceramic, polymer, or electrically insulating quartz.

8. The light emitting diode package of claim 1, further comprising an encapsulant covering the LED chip.

9. The light emitting diode package of claim 8, wherein the encapsulant further includes fluorescent powder mixed therein.

10. The light emitting diode package of claim 1 further comprising another wire, wherein the LED chip further comprises another electrode disposed on the semiconductor structure and the same said at least an electrical portion includes a first electrical portion and a second electrical portion, the wire connecting with the first electrical portion and the another wire connecting the another electrode to the second electrical portion, the another wire having two joints separated from each other and both connecting with the second electrical portion.

11. A light emitting diode (LED) package, comprising:
a substrate having a first electrical portion and a second electrical portion;
an LED chip mounted on the first electrical portion of the substrate, the LED chip comprising a semiconductor structure and two electrodes disposed on the semiconductor structure; and
two wires electrically connecting the electrodes to the first electrical portion and the second electrical portion, respectively, and each wire having a first curved portion connecting a corresponding electrode to a corresponding electrical portion and a second curved portion extending outwardly from a first joint between the first curved portion and the corresponding electrical portion to have a second joint with the corresponding electrical portion;
wherein both of the first joint and the second joint of each wire contact the corresponding electrical portion of the substrate.

12. The light emitting diode package of claim 11, wherein the first curved portion of the each wire is coplanar with the second curved portion of the each wire.

13. The light emitting diode package of claim 12, wherein a length of the first curved portion is larger than that of the second curved portion of the each wire.

14. The light emitting diode package of claim 13, wherein a curvature of the first curved portion is larger than that of the second curved portion.

15. The light emitting diode package of claim 11, wherein the first curved portion of each wire extends from the corresponding electrode to the first joint of each wire, and the second curved portion of each wire extends from the first joint of each wire to the second joint of each wire.

* * * * *